(12) United States Patent　(10) Patent No.: US 7,305,167 B2
Hutchinson　(45) Date of Patent: Dec. 4, 2007

(54) TRAPEZOIDAL RIDGE WAVEGUIDE ORIENTED AWAY FROM <110> DIRECTION

(75) Inventor: John M. Hutchinson, Santa Barbara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/394,563

(22) Filed: Mar. 31, 2006

(65) Prior Publication Data

US 2007/0237482 A1　Oct. 11, 2007

(51) Int. Cl.
*G02B 6/10* (2006.01)

(52) U.S. Cl. ...................................................... 385/131

(58) Field of Classification Search .................. 385/131
See application file for complete search history.

(56) References Cited

OTHER PUBLICATIONS

James P. Schaffer et al., "The Science and Design of Engineering Materials", 1999, Second Ed., pp. 71-77.*

Aoki, M. et al., "InP-Based Reversed-Mesa Ridge-Waveguide Structure for High-Performance Long-Wavelength Laser Diodes," *IEEE Journal Of Selected Topics in Quantum Electronics*, vol. 3, No. 2, Apr. 1997, pp. 672-683.

* cited by examiner

*Primary Examiner*—Michelle Connelly-Cushwa
*Assistant Examiner*—Jerry T Rahll
(74) *Attorney, Agent, or Firm*—Blakely, Sokoloff, Taylor & Zafman LLP

(57) ABSTRACT

According to embodiments of the present invention, an optical device includes a ridge waveguide having the ridge oriented on the waveguide core layer at an angle away from the <110> direction of the (100) plane of (100) Indium Phosphide substrate. The ridge waveguide may be a laser diode, a Mach-Zehnder modulator, or other suitable optical device.

15 Claims, 5 Drawing Sheets

TRAPEZOIDAL RIDGE WAVEGUIDE ORIENTED AWAY FROM <110> DIRECTION

BACKGROUND

1. Field

Embodiments of the present invention relate to optical devices and, in particular, to optical waveguides.

2. Discussion of Related Art

In general, optical receivers and transmitters may be used to receive data and/or other information on optical signals. Traditional optical transmitters and receivers have limitations, however. For example, traditional waveguides that may be used to guide optical signals have limitations.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF EMBODIMENTS

Figure 1:
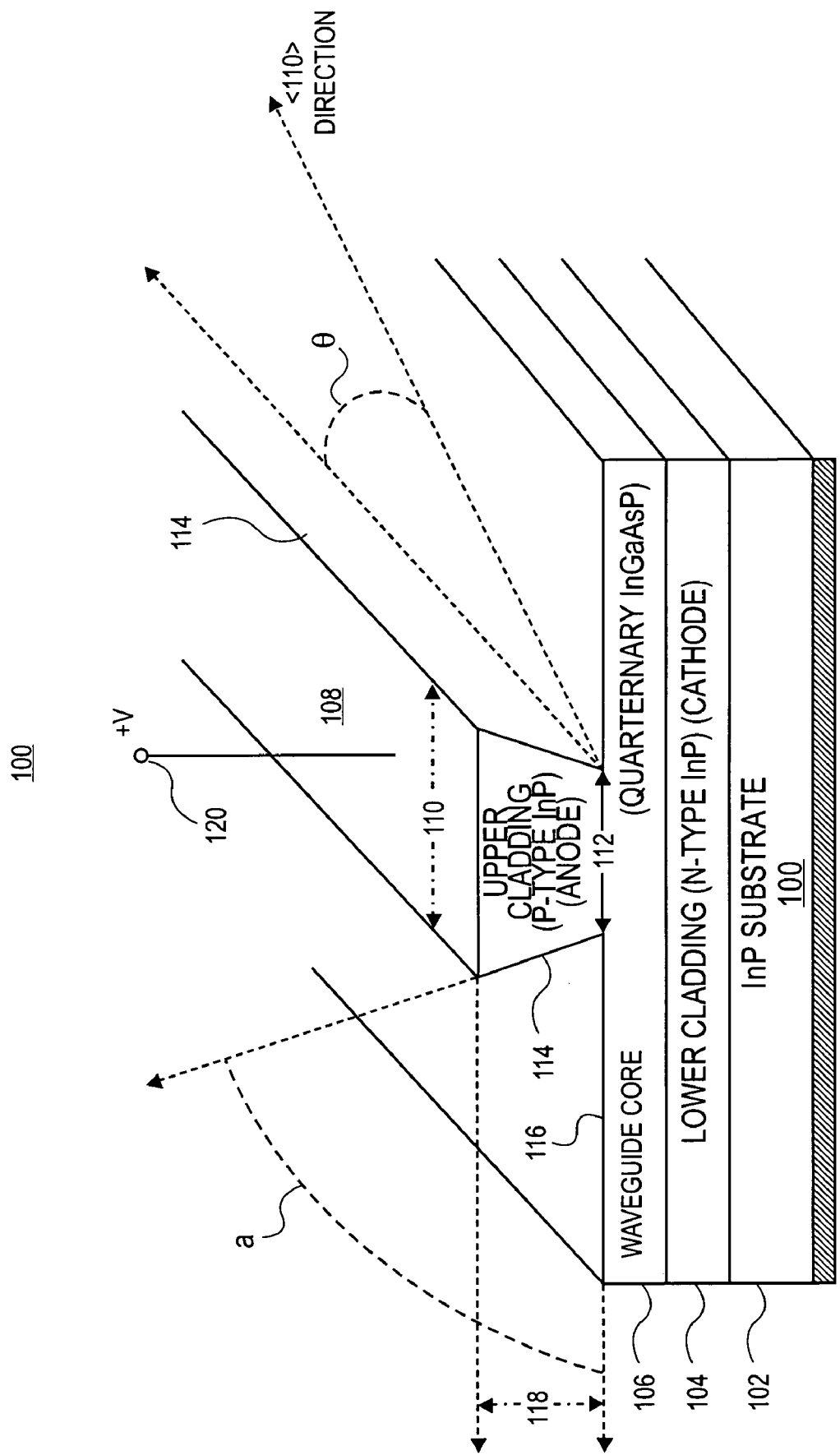
FIG. 1 is a perspective diagram of an optical device according to an embodiment of the present invention.

FIG. 1 is a perspective diagram of an optical device 100 according to an embodiment of the present invention. In the illustrated embodiment, the optical device includes a base 102. A lower cladding layer 104 is disposed on the base 102. A waveguide core layer 106 is disposed on the lower cladding layer 104. An upper cladding layer 108 is disposed on the waveguide core layer 106.

In one embodiment, the base 102 is formed from single crystal Indium Phosphide (InP). The InP crystal in the base 102 has planes that, describe the orientation of the plane of atoms relative to the principle crystalline axes. Using Miller indices and nomenclature a specific plane may be annotated as (hkl) and a family of planes may be annotated as {hkl}. The Miller indices are determined from the reciprocals of the points at which the crystal plane intersects the principal crystalline axes.

In the illustrated embodiment, the orientation of the type of crystalline InP in the base 102 is (100). Note that for any given plane in a cubic crystal there are five other equivalent planes. Thus, the six sides of the cube comprising the basic unit cell of the crystal in the base 102 are all considered {100} planes or in the {100} family of planes. The notation {xyZ} refers to all six of the equivalent planes.

The InP crystal of the base 102 also has directions, which are defined as the direction normal to the respective plane. Using Miller indices and nomenclature a specific direction may be annotated by [hkl] and a family of directions may be annotated by <hkl>.

In the illustrated embodiment, the upper cladding layer 108 forms a ridge having an inverse isosceles trapezoid shape. That is, the upper cladding layer 108 has a shape of a polygon that has fours sides, four vertices, and a line of symmetry bisecting one pair of parallel, opposite sides. A width 110 of the upper cladding layer 108 is greater than a width 112 of the upper cladding layer 108. For some embodiments, the width 110 of the upper cladding layer 108 may be approximately three microns (3 μm) and the width 112 of the upper cladding layer 108 may be approximately two microns (2 μm).

In the illustrated embodiment, the upper cladding layer 108 is disposed on the waveguide core layer 106 such that the inverse isosceles trapezoid is oriented on the waveguide core layer 106 at an angle θ away from a <110> direction on the base 102. For some embodiments, the angle θ is greater than or equal to approximately one degree and less than or equal to approximately forty-four degrees. In one embodiment, the angle θ is approximately is seven degrees.

In the illustrated embodiment, the upper cladding layer 108 includes sidewalls 114. An individual sidewall 114 may have an angle α in relation to a top surface 116 of the base 102. In one embodiment, the angle α may be greater than or less than approximately eighty-seven degrees. In embodiments of the present invention, as the ridge formed by the upper cladding layer 208 is oriented further away from the <110> direction the steeper the sidewall 114 angles α if the ridge formed by the upper cladding layer 108 may be.

In the illustrated embodiment, the upper cladding layer 108 has a height 118. The height 118 may be approximately two microns (2 μm). Thus, the ratio of the upper cladding width 112 to the upper cladding height is 2 μm/2 μm or one. The waveguide core layer 106 may have a thickness of 0.35 μm.

As described above, the base may be wafer or substrate made from (100) InP. In the illustrated embodiment, the lower cladding layer 104 material is N-type indium phosphorous (N—InP) semiconductor material, the waveguide core layer 106 material is quarternary indium gallium arsenide phosphide (InPGaAsP), and the upper cladding layer 108 material is P-type indium phosphorous (P—InP) semiconductor material. Of course, other suitable materials may be used. For example, other suitable combinations of cladding/core materials include InP/InGaP, InP/InAlGaAs, and/or GaAs/AlGaAs.

For some embodiments, the optical device 100 may be a double heterostructure laser diode in that the upper cladding layer 108 may be an anode of the laser diode, the lower cladding layer 104 may be a cathode of the laser diode, the waveguide core layer 106 may be the lower bandgap material sandwiched between the anode and the cathode. A voltage 120 may be coupled applied between an anode coupled to the upper cladding layer 108 and a cathode coupled to the lower cladding layer 104. Alternatively, the voltage 120 may be applied between the anode coupled to the upper cladding layer 108 and an electrical contact through the substrate 102. In other embodiments, the optical device 100 may also be a waveguide modulator, such as a Mach-Zehnder modulator, Fabry-Perot modulator, ring modulator, or other suitable modulator. In still other embodiments, the optical device 100 may be a photodetector and/or optical amplifier.

Figure 2:
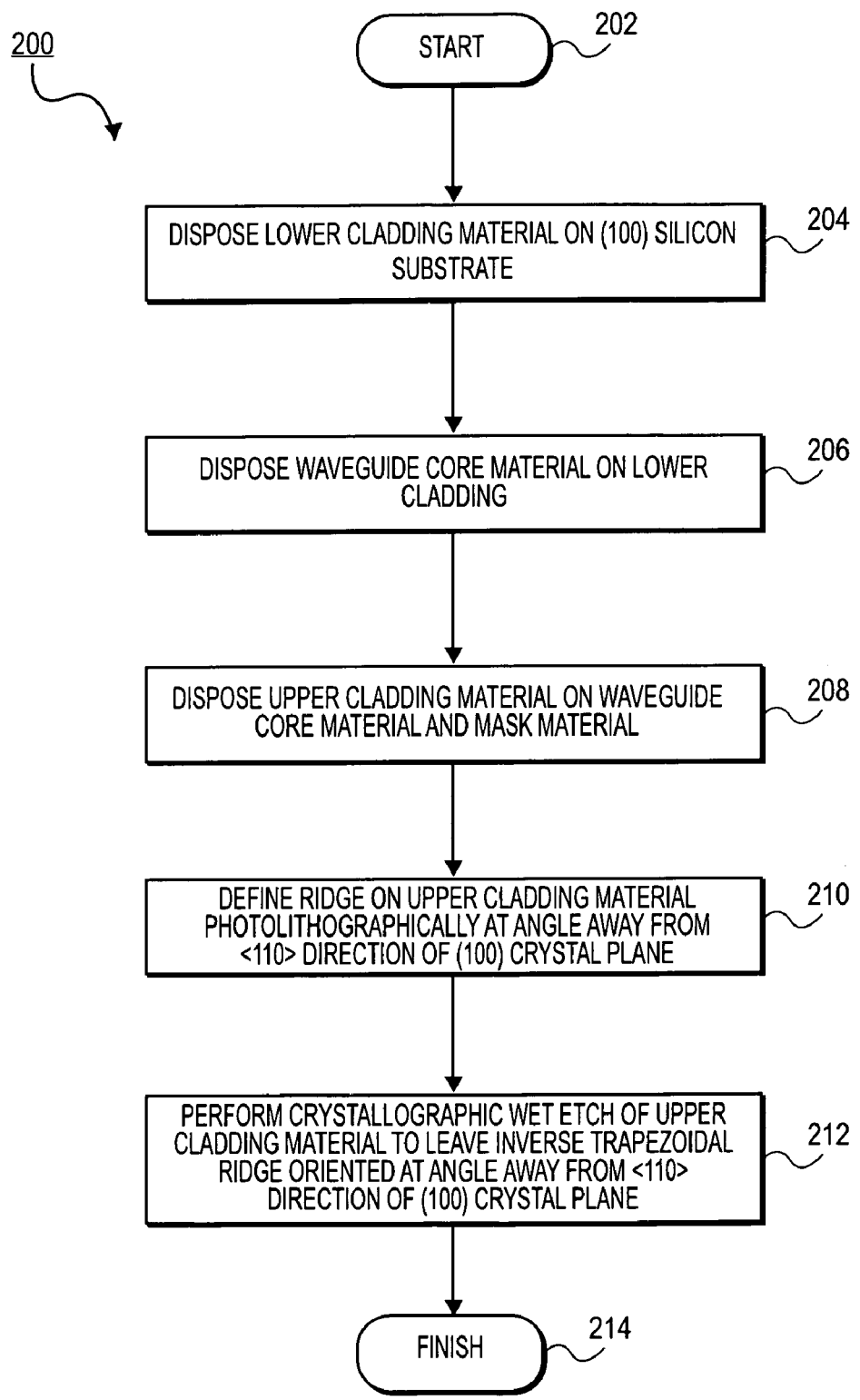
FIG. 2 is a flowchart illustrating a method for fabricating the optical device depicted in FIG. 1 according to an embodiment of the present invention.

FIG. 2 is a flowchart illustrating a process 200 for fabricating the optical device 100 according to an embodiment of the present invention. The process 200 begins with a block 202 and control passes to a block 204.

In the block 204, the lower cladding material may be deposited on a substrate. In one embodiment, N-type InP material may be deposited on (100) InP substrate.

In a block 206, the waveguide core material may be grown on the lower cladding material. In one embodiment, quarternary InPGaAsP may be grown on the InP lower cladding material.

In a block 208, the upper cladding material may be deposited on the waveguide core material. In one embodiment, P-type InP material may be deposited on the quarternary InPGaAsP material.

In a block 210, a ridge for the optical device 100 may be photolithographically transcribed on the upper cladding material at an angle off the <110> direction of the (100) plane of the base of the optical device 100. In one embodiment, a selected edge of a mask may be rotated relative to the base such that the resulting printed pattern is oriented at an angle off the <110> direction of the (100) plane of the base. In an alternative embodiment the mask used already may have the ridge aligned at an angle off the <110> direction of the (100) plane of the base of the optical device 100 when the pattern is printed on the upper cladding material.

In a block 212, a crystallographic wet etch may be performed on the upper cladding material to preferentially remove upper cladding material to form sidewalls for the optical device 100. In one embodiment, the wet-etchant may be a mixture such as $HCl:H_3PO_4$. The resulting ridge of the optical device 100 may be oriented at an angle off the <110> direction of the (100) plane of the base of the optical device 100 and have sidewalls greater than or less than eighty-seven degrees relative to the top surface of the base.

In a block 214, the process 200 finishes.

The operations of the process 200 have been described as multiple discrete blocks performed in turn in a manner that may be most helpful in understanding embodiments of the invention. However, the order in which they are described should not be construed to imply that these operations are necessarily order dependent or that the blocks be performed in the order in which the blocks are presented. Of course, the process 200 is an example method and other methods may be used to implement embodiments of the present invention.

Figure 3:
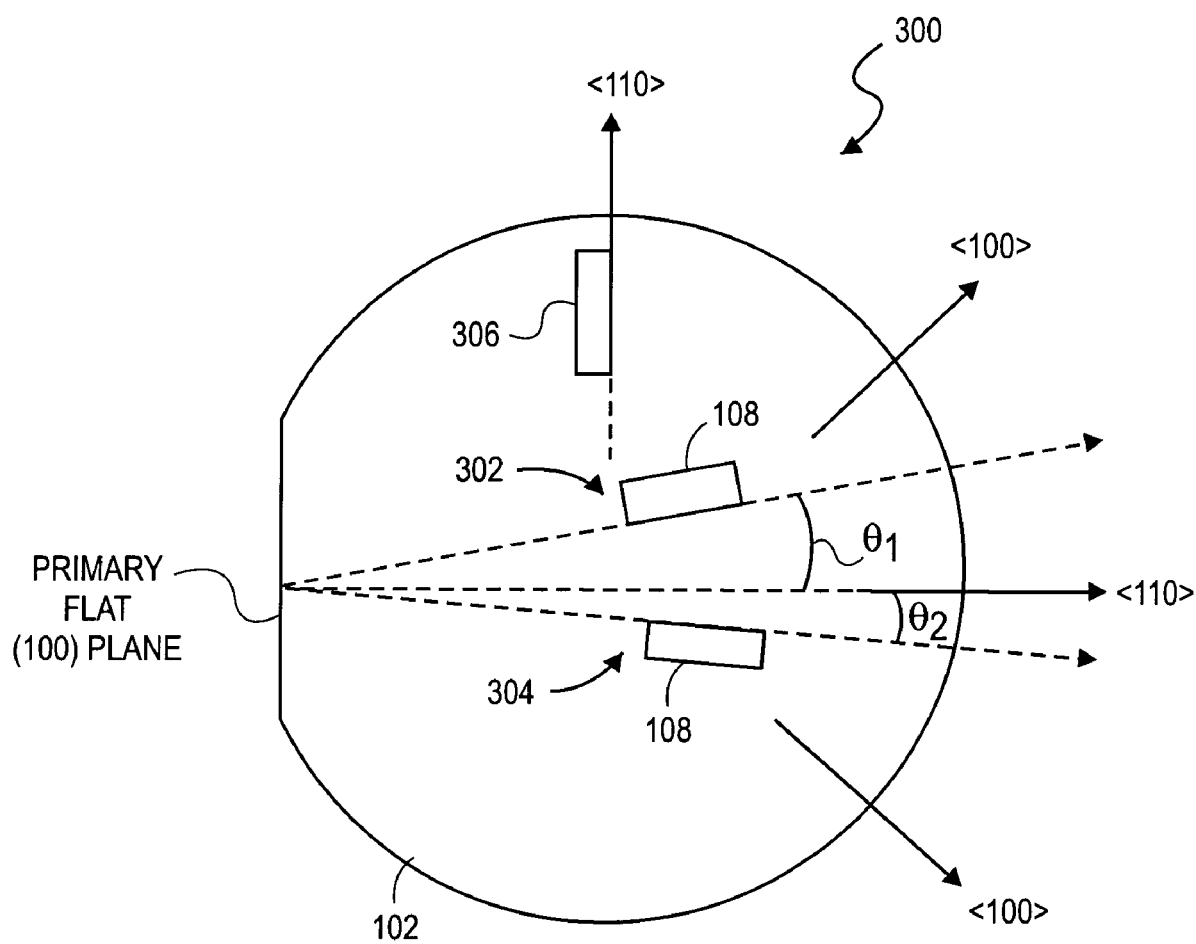
FIG. 3 is a top view of a (100) Indium Phosphide base according to an embodiment of the present invention.

FIG. 3 is a top view of an integrated optical system 300 including the InP substrate 102 according to an embodiment of the present invention. In the illustrated embodiment, the substrate 102 has three optical devices 302, 304, and 306 formed thereon. The optical device 302 may be a ridge waveguide having its anode 108 oriented at an angle $\theta_1$ off the <110> direction of the (100) plane of the substrate 102. The optical device 304 may be a ridge waveguide having its anode 108 oriented at an angle $\theta_2$ off the <110> direction of the (100) plane of the substrate 102. The angle $\theta_1$ may be different from the angle $\theta_2$. The optical device 306 may be a ridge waveguide or other optical device oriented along the <110> direction of the (100) plane of the substrate 102.

In some embodiments, some embodiments, any one of the optical devices 302, 304, and/or, 306 may be a waveguide modulator, a photodetector, and/or optical amplifier. Thus, the substrate 102 may include optical devices such as one or more laser diodes, waveguide modulators, photodetectors, and/or optical amplifiers, each of which may have a different or the same angle θ orientation away from or along the <110> direction on the base 102, and/or each of which may have one or more sidewall angles α in relation to the top surface 116 of the base 102 that is different or the same as the sidewall angles α of other optical devices disposed in or on the substrate 102.

Figure 4:
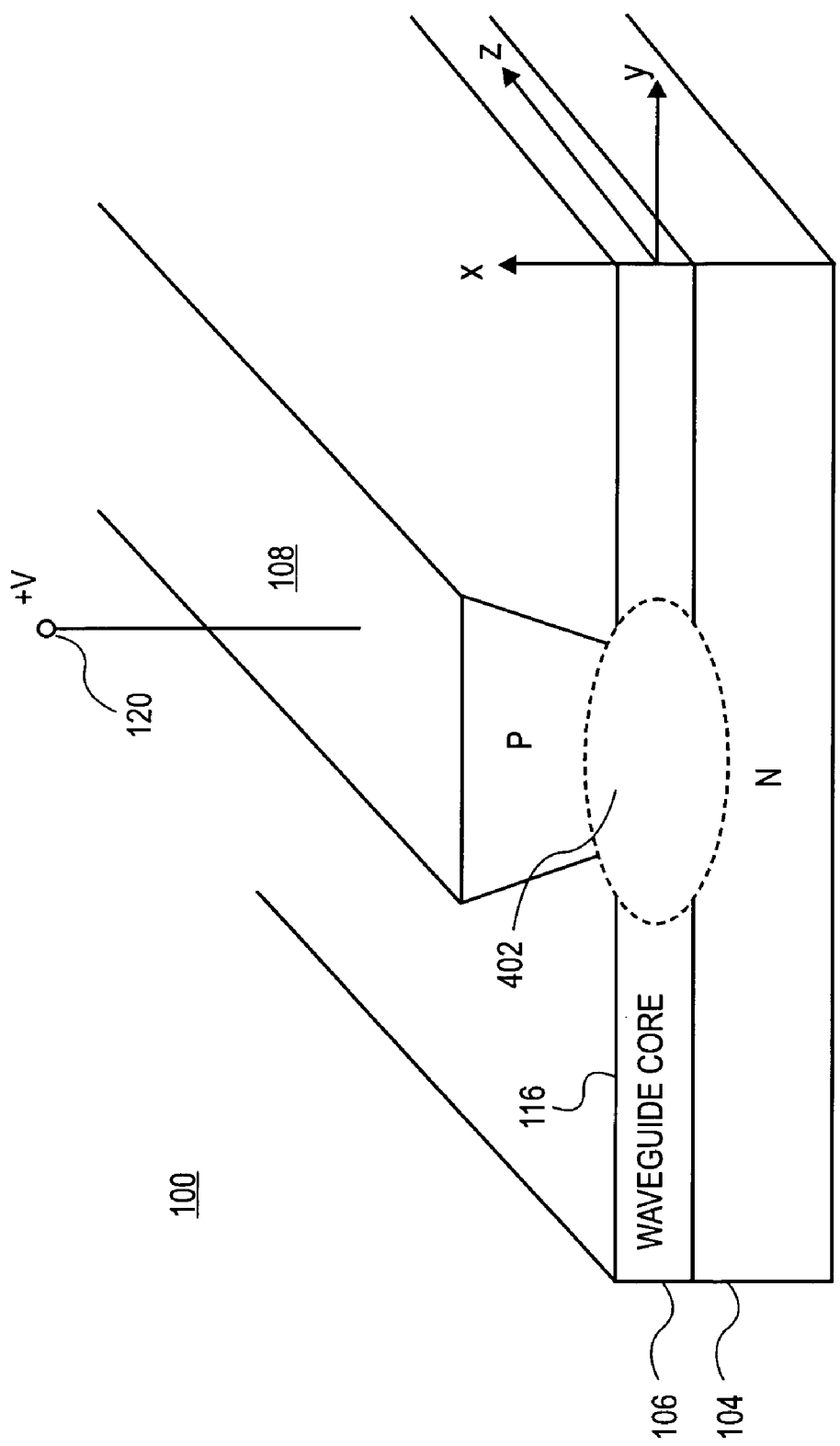
FIG. 4 is a simplified cross-section diagram of an optical device according to an embodiment of the present invention.

FIG. 4 is a perspective diagram illustrating how the optical device 100 may operate if applying an optical signal to the optical device 100 according to an embodiment of the present invention. A dashed line 402 indicates the optical mode. The voltage 120 may forward bias the optical device 100 through metallic contacts (not shown). Holes from the P-type upper cladding layer 108 may be injected into the N-type lower cladding layer 104 through the waveguide core layer 106. Electrons from the N-type lower cladding layer 104 may be injected into the P-type upper cladding layer 108 through the waveguide core layer 106.

While holes are the dominant carrier in the upper cladding layer 108 and electrons are dominant in the lower cladding layer 104, free electrons and holes exist simultaneously in the waveguide core layer 106. When an electron and a hole are present in the waveguide core layer 106, they may recombine by spontaneous emission in that the electron may re-occupy the energy state of the hole thereby emitting a photon having energy equal to the difference between the electron and hole states involved. Spontaneous emission initiates oscillation of the laser diode.

As an optical signal propagates within the optical device 100 the ridge width may confine the optical mode (dash outline 402) in the y-direction (index loaded). Light may propagate in the z-direction following the ridge waveguide.

Because the P—InP ridge of the upper cladding material 108 not only defines the optical mode 402 but also forms the anode of the diode, a low resistance current path up through the ridge of the upper cladding material 108 may be maintained. The relative resistance of the optical device 108 may be reduced for steeper sidewall angles at a given ridge width 120 shown in FIG. 1 for two different values of the ratio of ridge height to base width 120. For high-speed/low-capacitance diodes, a height-to-width ratio of one may result in the ridge resistance contribution being reduced by twenty-one percent (21%) compared to the ridge resistance contribution of conventional high-speed/low-capacitance diodes. The thermal resistance of the ridge also may be reduced in a similar fashion, allowing for more efficient heat transfer away from the waveguide.

Figure 5:
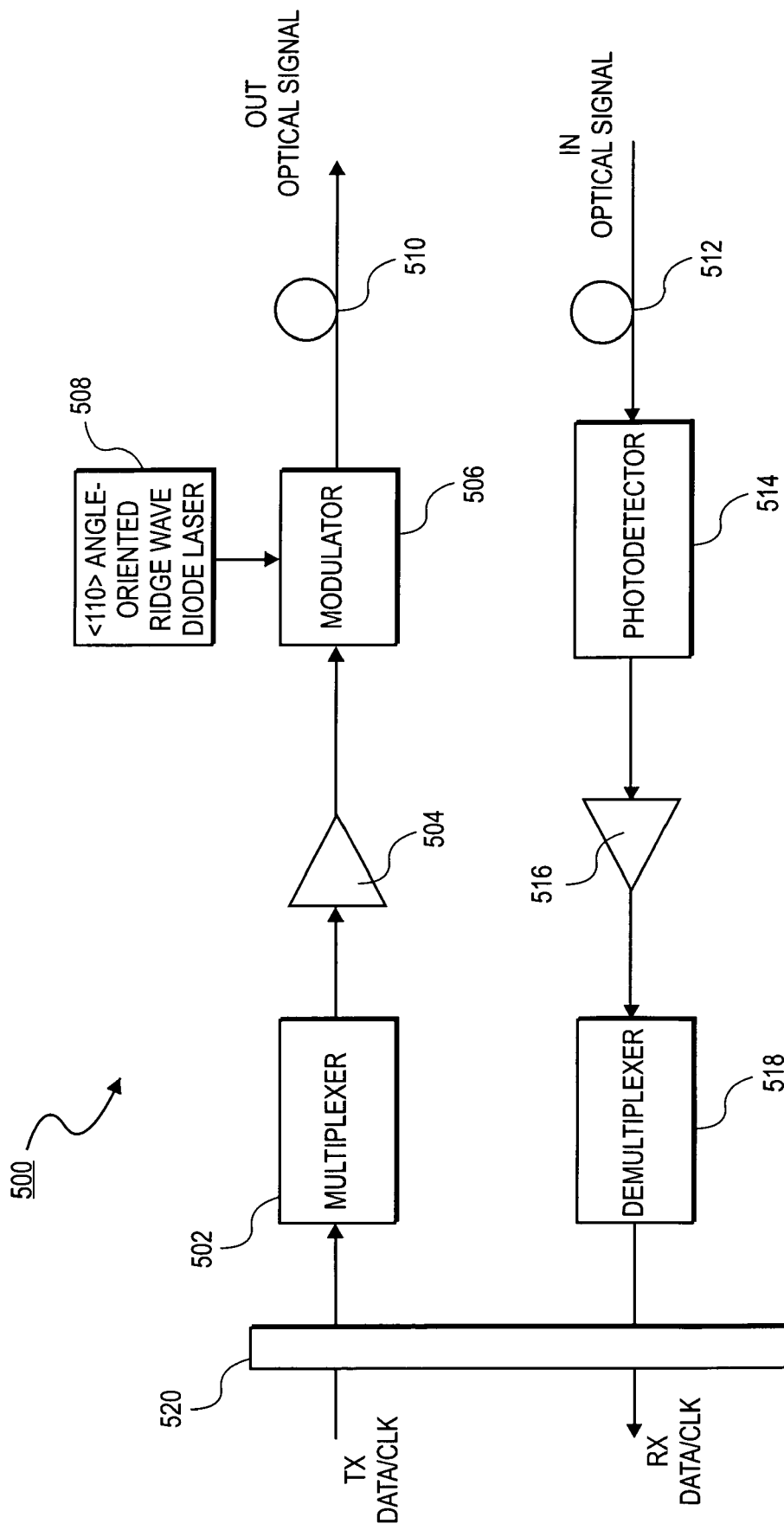
FIG. 5 is a simplified block diagram of an optical system according to an embodiment of the present invention.

FIG. 5 is a high-level block diagram of a transponder and/or transceiver 500 according to an embodiment of the present invention. In the illustrated embodiment, data and a clock are input to a multiplexer 502 via the connector 520. In one embodiment, the data may be sixteen synchronized data lines and the multiplexer 502 may be a sixteen-to-one multiplexer that may multiplex the sixteen data lines to a ten gigabit per second (10 Gbps) serial data stream.

The data may be coupled to a driver 504. In one embodiment, the driver 504 may boost the amplitude of the data stream and a modulator 506, such as a Mach-Zehnder, for example, may convert the amplified serial data stream to an optical signal using light from the laser 508. For some embodiments, the modulator 506 and/or the laser 508 may include ridge waveguides and/or ridge waveguide diodes such as the optical device 100. The optical signal may be launched into an optical fiber 510.

In the illustrated embodiment, an optical fiber 512 receives an optical signal and couples it to a photodetector 514, which converts the optical signal into an electrical signal. The photodetector 514 is coupled to an amplifier 516, such as a transimpedance amplifier (TIA), for example whose outputs are coupled to a demultiplexer 518. The demultiplexer 518 may separate the clock and separate the data into sixteen data lines from a serial data stream.

For some embodiments, the data and clock are coupled to the transponder and/or transceiver 500 via a connector 520. The connector 520 may be a 300-pin multi-source agreement (MSA) connector, an XFP connector, a XENPAK connector, or other suitable connector.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the process 300. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.), such as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
a ridge waveguide having:
a first cladding layer disposed on a base formed from (100) Indium Phosphide (InP), the base having at least one <110> direction;
a core layer disposed on the first cladding layer; and
a second cladding layer disposed on the core layer, the second cladding layer being oriented on the core layer at an angle away from the <110> direction of the (100) plane of the base, wherein the angle the ridge waveguide is oriented away from the <110> direction of the base is greater than or equal to approximately one degree away from the <110> direction of the base and less than or equal to approximately forty-four degrees away from the <110> direction of the base.

2. The apparatus of claim 1, wherein the ridge waveguide further comprises at least one sidewall having an angle in relation to a surface of the base that is greater than or less than approximately eighty-seven degrees.

3. The apparatus of claim 1, wherein the ridge waveguide includes a base and a top, wherein the base width is less than the top width.

4. The apparatus of claim 1, wherein the ridge waveguide comprises a diode, wherein the first cladding layer comprises N-type InP material, wherein the core layer comprises quarternary InPGaAsP material, and wherein the second cladding layer comprises P-type InP material and forms an anode of the diode.

5. The apparatus of claim 1, wherein the ridge waveguide comprises at least one of a modulator, a photodetector and/or an amplifier.

6. The apparatus of claim 5, wherein the ridge waveguide comprises a Mach-Zehnder modulator.

7. The apparatus of claim 5, further comprising a second ridge waveguide having a third cladding layer oriented on the core layer at an angle away from the <110> direction of the (100) plane of the base, wherein the second ridge waveguide includes at least one of a diode, an amplifier, a photodetector, and/or a modulator.

8. The apparatus of claim 7, wherein the third cladding layer is oriented away from the <110> direction of the (100) plane of the base is different from the angle the first cladding layer is oriented away from the <110> direction of the (100) plane of the base.

9. The apparatus of claim 8, wherein the second ridge waveguide further comprises at least one sidewall having an angle in relation to the surface of the base that is different from the angle of the sidewall of the first ridge waveguide has in relation to the surface of the base.

10. A method of fabricating a ridge waveguide, comprising:
disposing a first cladding layer on a base formed from (100) Indium Phosphide (InP);
disposing a core layer on the first cladding layer;
disposing a second cladding layer on the core layer; and
forming a ridge from the second cladding layer, the ridge being oriented at an angle away from the <110> direction of the base, wherein the angle the ridge is oriented away from the <110> direction of the base is greater than or equal to approximately one degree away from the <110> direction of the base and less than or equal to approximately forty-four degrees away from the <110> direction of the base.

11. The method of claim 10, further comprising fabricating a mask to have a selected edge aligned at the angle away from the <110> direction of the base.

12. The method of claim 10, further comprising aligning a selected edge of a mask at the angle away from the <110> direction of the base.

13. A system, comprising:
a 300-pin connector coupled to receive an electrical data signal; and
a modulator to generate an optical signal from the electrical data signal; the modulator having a ridge waveguide having a first cladding layer disposed on a base formed from (100) InP, the base having at least one <110> direction, a core layer disposed on the first cladding layer, and a second cladding layer disposed on the core layer, the second cladding layer being oriented on the core layer at an angle away from the <110> direction of the base, wherein the angle the ridge waveguide is oriented away from the <110> direction of the base is greater than or equal to approximately one degree away from the <110> direction of the base and less than or equal to approximately forty-four degrees away from the <110> direction of the base.

14. The system of claim 13, wherein the ridge waveguide includes a top and a base.

15. The system of claim 14, wherein the top is approximately 3 μm in width and the base is approximately 2 μm in width.

* * * * *